(12) United States Patent
Kim et al.

(10) Patent No.: US 9,967,973 B2
(45) Date of Patent: May 8, 2018

(54) ELECTRODE ARRANGEMENT WITH 3D STRUCTURE AND FABRICATION METHOD THEREOF

(71) Applicant: GWANGJU INSTITUTE OF SCIENCE AND TECHNOLOGY, Gwangju (KR)

(72) Inventors: Sohee Kim, Gwangju (KR); Namsun Chou, Gwangju (KR)

(73) Assignee: GWANGJU INSTITUTE OF SCIENCE AND TECHNOLOGY, Gwangju (KR)

( * ) Notice: Subject to any disclaimer, the term of this patent is extended or adjusted under 35 U.S.C. 154(b) by 0 days. days.

(21) Appl. No.: 14/584,291

(22) Filed: Dec. 29, 2014

(65) Prior Publication Data

US 2015/0351221 A1    Dec. 3, 2015

(30) Foreign Application Priority Data

May 27, 2014 (KR) .................. 10-2014-0063544

(51) Int. Cl.
*H05K 1/02* (2006.01)
*H05K 3/38* (2006.01)

(52) U.S. Cl.
CPC ............ *H05K 1/0283* (2013.01); *H05K 3/38* (2013.01); *H05K 2201/0133* (2013.01); *H05K 2201/0162* (2013.01); *H05K 2201/09263* (2013.01); *H05K 2203/1105* (2013.01)

(58) Field of Classification Search
CPC ....................................... H05K 1/393
USPC ....................................... 174/254
See application file for complete search history.

(56) References Cited

U.S. PATENT DOCUMENTS

| | | | | |
|---|---|---|---|---|
| 5,981,870 A | * | 11/1999 | Barcley .............. | H05K 1/0224 174/254 |
| 6,475,933 B1 | * | 11/2002 | Brown .................. | C08J 5/18 428/295.1 |
| 7,491,892 B2 | * | 2/2009 | Wagner ............... | H05K 1/0283 174/254 |
| 8,207,473 B2 | * | 6/2012 | Axisa .................. | B32B 37/185 174/254 |
| 2007/0159753 A1 | * | 7/2007 | Randall ............... | H05K 9/009 361/111 |

(Continued)

FOREIGN PATENT DOCUMENTS

JP    2009254902 A    11/2009

OTHER PUBLICATIONS (Supportive Materials on Dec. 7, 2013) Namsun Chou et al., A fabrication method of out-of-plane stretchable and flexible electrodes based on PDMS, article, Dec. 7, 2013, 8 pages, vol. 8923, Proc. of SPIE.

(Continued)

*Primary Examiner* — Hoa C Nguyen
*Assistant Examiner* — Stanley Tso
(74) *Attorney, Agent, or Firm* — Hauptman Ham, LLP

(57) ABSTRACT

An electrode arrangement which is based on elastomer and has elasticity and flexibility may include: an elastomer substrate; first and second pads arranged over the substrate; and a conductive wire connecting the first and second pads. One or more regions of the conductive wire may be bent in a vertical or horizontal direction with respect to the substrate.

11 Claims, 21 Drawing Sheets

(56) References Cited

U.S. PATENT DOCUMENTS

| | | | |
|---|---|---|---|
| 2010/0238636 A1* | 9/2010 | Mascaro | B29C 45/14639 |
| | | | 361/750 |
| 2010/0307803 A1* | 12/2010 | Paul | B32B 7/12 |
| | | | 174/257 |
| 2013/0333094 A1* | 12/2013 | Rogers | A41D 19/015 |
| | | | 2/161.7 |
| 2014/0022746 A1* | 1/2014 | Hsu | H05K 1/0271 |
| | | | 361/750 |
| 2014/0026682 A1* | 1/2014 | Liu | G01L 1/06 |
| | | | 73/862.637 |
| 2014/0213937 A1* | 7/2014 | Bianchi | A61B 5/0816 |
| | | | 600/595 |
| 2015/0373831 A1* | 12/2015 | Rogers | H01L 23/22 |
| | | | 429/121 |
| 2015/0380355 A1* | 12/2015 | Rogers | H01L 23/538 |
| | | | 257/773 |

OTHER PUBLICATIONS (Supportive Materials on Apr. 3, 2014) Namsun Chou et al., A Fabrication Method of Flexible and Stretchable PDMS Electrodes, Thesis book, Apr. 3-5, 2014, pp. 245-246, Gwangju Institute Science and Technology, School of Mechatronics and Department of Medical System Engineering.
John A. Rogers et al., "Materials and Mechanics for Stretchable Electronics", Science vol. 327, Mar. 26, 2010, p. 1603-1606.
Korean Office Action dated Jan. 20, 2016 in connection with the counterpart Korean Patent Application No. 10-2014-0063544.

* cited by examiner

ELECTRODE ARRANGEMENT WITH 3D STRUCTURE AND FABRICATION METHOD THEREOF

CROSS REFERENCE TO RELATED APPLICATION

This application claims the benefit of Korean Patent Application No. 10-2014-0063544, filed on May 27, 2014, entitled "ELECTRODE ARRANGEMENT WITH 3D STRUCTURE AND FABRICATION METHOD THEREOF", which is hereby incorporated by reference in its entirety into this application.

BACKGROUND

1. Technical Field

The present disclosure relates to an electrode arrangement and a method for fabricating the same, and more specifically, to an electrode arrangement with a three-dimensional (3D) structure, which is formed over an elastomer substrate and has elasticity and flexibility, and a method for fabricating the same.

2. Related Art

The demand for a flexible electronic device capable of overcoming the limit of an electronic device existing over a solid substrate has increased as the application field of electronic devices is widened. For example, electronic devices which are used as a flexible display, smart clothes, a dielectric elastomer actuator (DEA), a biocompatible electrode, and an in-body electrical signal sensor are required to have an elastic and flexible structure. One of basic and important technologies in the field of the electronic devices having elasticity and flexibility is to form a flexible electrode while maintaining conductivity.

As the method for fabricating a flexible electrode, the following methods have been reported. According to a first method, carbon nanotubes, transparent fluoride polymer, and ionic liquid may be mixed to fabricate a flexible electrode in a paste form. According to a second method, metal particles and polyacrylic acid mixture may be processed in a paste form so as to fabricate a pattern through an inkjet method. According to a third method, a metal layer may be formed over a corrugated PDMS (polydimethylsiloxane) substrate such that an electrode has flexibility as much as the corrugations are flattened. However, these methods have a problem in that the flexibility of the used material or corrugated substrate is limited, the conductivity of the used material or corrugated substrate rapidly decreases as it stretches and contracts, or the used material or corrugated substrate mechanically breaks. Furthermore, since the fabrication process is not generalized, the reliability of the fabrication process and the yield of electrodes are low. In addition, an operator is required to have a high level of skill. Thus, the fabrication process is not suitable for a mass production process.

SUMMARY

Various embodiments are directed to an electrode arrangement including a conductive wire bent in vertical and horizontal directions with respect to a substrate formed of a flexible material such as elastomer, and a method for fabricating the same.

Also, various embodiments are directed to an electrode arrangement having more excellent elasticity and flexibility than existing electrodes and a method for fabricating the same.

Also, various embodiments are directed to an electrode arrangement based on a flexible material such as elastomer which can be mass-produced and has a high yield, and a method for fabricating the same.

Other objects and advantages of the present invention can be understood by the following description, and become apparent with reference to the embodiments of the present invention. Also, it is obvious to those skilled in the art to which the present invention pertains that the objects and advantages of the present invention can be realized by the means as claimed and combinations thereof.

In an embodiment, an electrode arrangement which is based on elastomer and has elasticity and flexibility may include: an elastomer substrate; first and second pads arranged over the substrate; and a conductive wire connecting the first and second pads. One or more regions of the conductive wire may be bent in a vertical or horizontal direction with respect to the substrate.

In an embodiment, a method for fabricating an electrode arrangement which is based on elastomer and has elasticity and flexibility may include: preparing a substrate; patterning a first pad pattern, a second pad pattern, and a conductive pattern over the substrate using photoresist, the conductive pattern connecting the first and second pad patterns while being bent in a horizontal direction with respect to the substrate; coating the substrate with a third insulating layer; patterning a conductive layer over the first and second pad patterns and the conductive pattern which are formed of photoresist; coating the substrate with a fourth insulating layer; patterning photoresist over the conductive layer along the first and second pad patterns and the conductive pattern; removing the insulating layer exposed over the substrate using the photoresist over the substrate as a mask; and removing all of the photoresists existing over the substrate.

DETAILED DESCRIPTION

Figure 1:
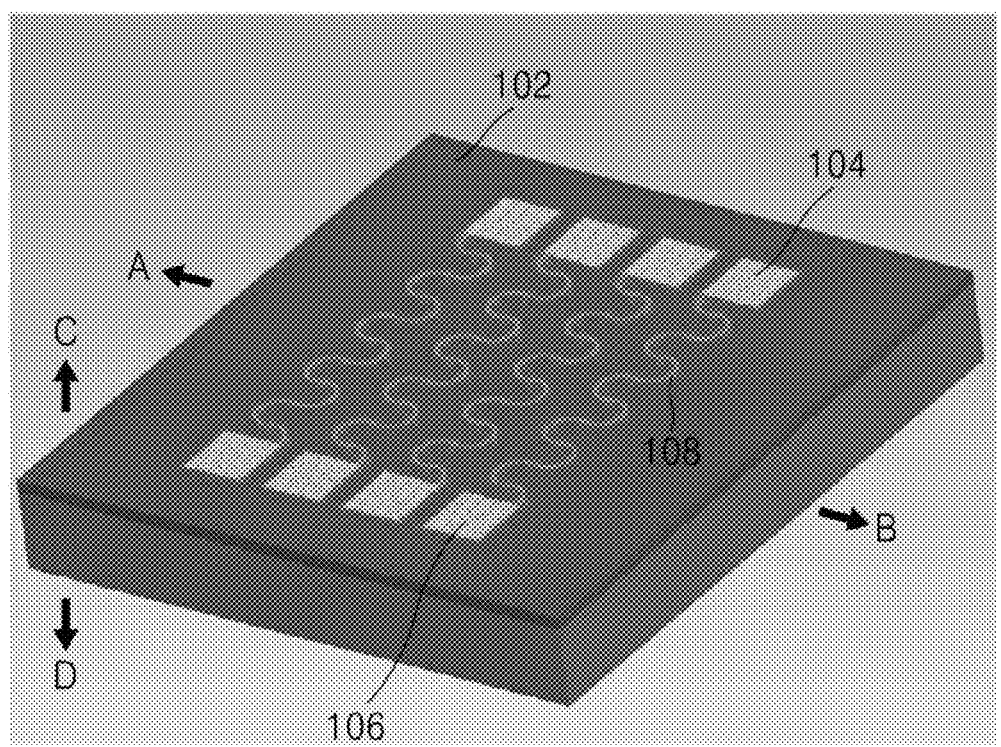
FIG. 1 is a configuration diagram of an electrode arrangement according to an embodiment of the present invention.

Exemplary embodiments will be described below in more detail with reference to the accompanying drawings. The disclosure may, however, be embodied in different forms and should not be construed as limited to the embodiments set forth herein. Rather, these embodiments are provided so that this disclosure will be thorough and complete, and will fully convey the scope of the disclosure to those skilled in the art. Throughout the disclosure, like reference numerals refer to like parts throughout the various figures and embodiments of the disclosure.

FIG. 1 is a configuration diagram of an electrode arrangement according to an embodiment of the present invention.

Referring to FIG. 1, the electrode arrangement according to the embodiment of the present invention may include a substrate 102, first and second pads 104 and 106 arranged over the substrate 102, and a conductive wire 108 connecting the first and second pads 104 and 106. A conductive material such as a metal may be exposed over the first and second pads 104 and 106. Furthermore, a conductive material such as a metal may also be contained in the conductive wire 108. Thus, the conductive material of the first pad 104 may be connected to the conductive material of the second pad 106 through the conductive material of the conductive wire 108.

The conductive wire 108 of the electrode arrangement according to the embodiment of the present invention may include one or more regions which are bent in a vertical or horizontal direction with respect to the substrate 102.

The horizontal direction with respect to the substrate 102 may indicate a direction parallel to the top or bottom surface of the substrate 102, as indicated by A and B in FIG. 1. That is, as illustrated in FIG. 1, the conductive wire 108 may be bent in an S-shape when seen from the top. This shape may be defined as a shape that the conductive wire 108 is bent in the horizontal direction.

Furthermore, the vertical direction with respect to the substrate 102 may indicate a direction facing the top or bottom surface of the substrate 102, as indicated by C and D in FIG. 1. Thus, a part of the conductive wire 108 may maintain a state in which the part is not in contact with the substrate 102. That is, the part of the conductive wire 108 may float from the substrate 102 when seen from the side. This shape may be defined as a shape that the conductive wire 108 is bent in the vertical direction.

Figure 2:
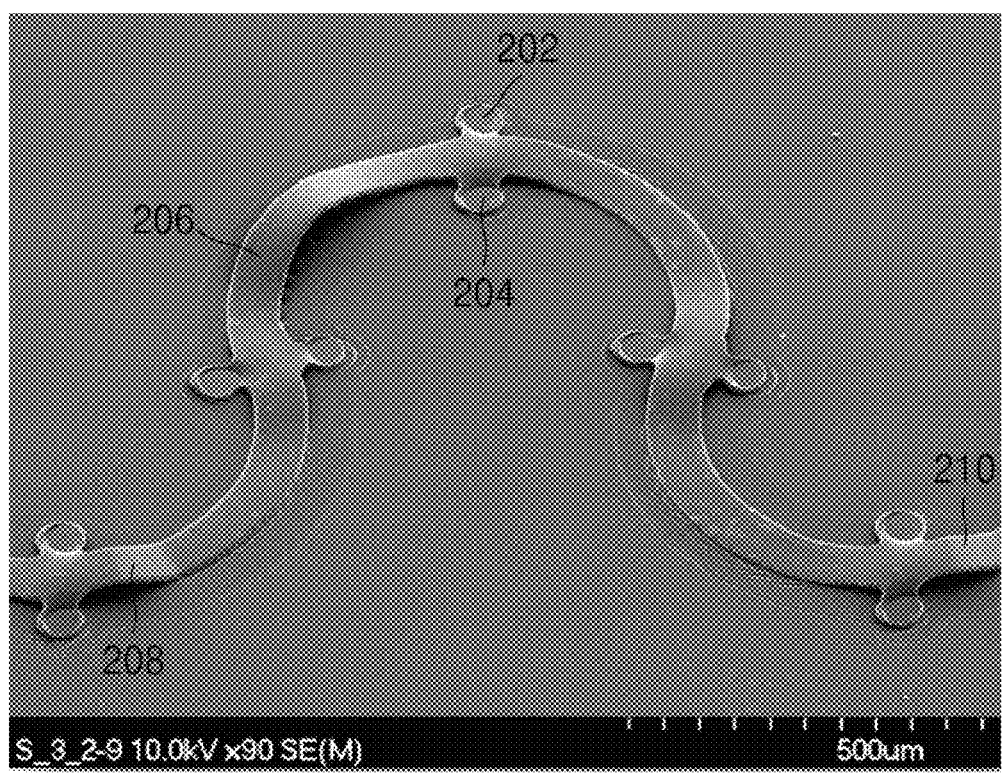
FIG. 2 is a partially expanded view of a conductive wire forming the electrode arrangement according to the embodiment of the present invention.

FIG. 2 is a partially expanded view of the conductive wire forming the electrode arrangement according to the embodiment of the present invention.

As illustrated in FIG. 2, regions 206, 208, and 210 of the conductive wire may be bent in the vertical direction, and float from the substrate without coming in contact with the substrate. In order to prevent separation of the conductive wire bent in the vertical or horizontal direction, fixation regions 202 and 204 may be formed at sides of the conductive wire as illustrated in FIG. 2.

As illustrated in FIGS. 1 and 2, the conductive wire forming the electrode arrangement according to the embodiment of the present invention may have a shape bent in the vertical or horizontal direction with respect to the substrate. Such a shape is in order to increase the elasticity and flexibility of the electrode arrangement according to the embodiment of the present invention.

Figure 3:
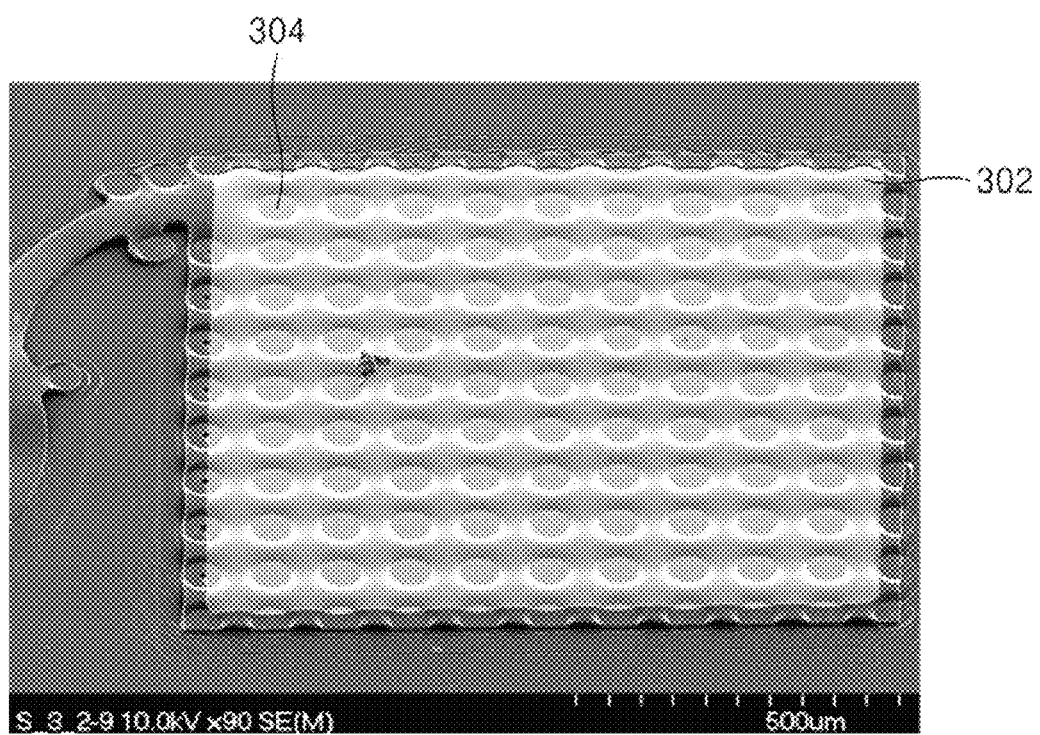
FIG. 3 is a partially expanded view of a pad forming the electrode arrangement according to an embodiment of the present invention.

FIG. 3 is a partially expanded view of the pad forming the electrode arrangement according to an embodiment of the present invention.

As illustrated in FIG. 3, a conductive material 302 such as a metal may be exposed over the pad arranged on the substrate. Furthermore, the pad may have fixation regions 304 for fixing the pad to the substrate, like the conductive wire. In the electrode arrangement according to the embodiment of the present invention, the entire region of the pad does not come in contact with the substrate, but only a part of the pad may come in contact with the substrate as illustrated in FIG. 3, when the pad is fixed. As such, the structure in which only the part of the pad is in contact with the substrate may increase the elasticity and flexibility of the electrode arrangement.

Hereafter, a method for fabricating an electrode arrangement according to an embodiment of the present invention will be described in detail with reference to FIGS. 4 to 17.

Figure 4:
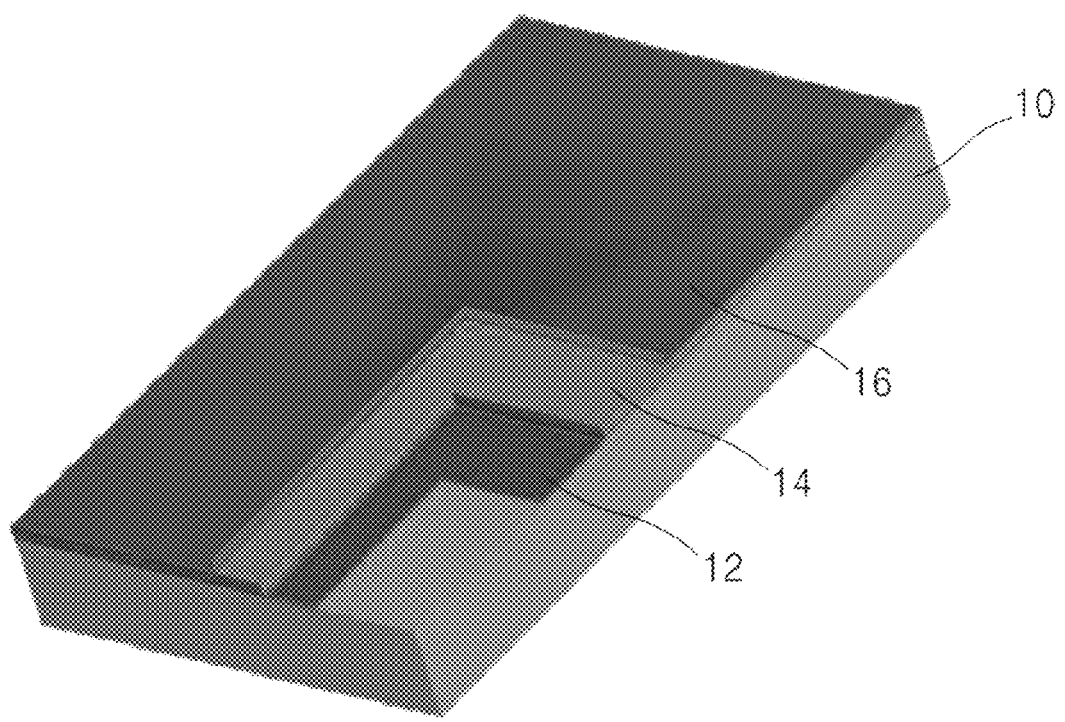
FIGS. 4 to 17 are diagrams illustrating a process of fabricating an electrode arrangement according to an embodiment of the present invention.

First, as illustrated in FIG. 4, a first insulating layer 12, an elastomer layer 14, and a second insulating layer 16 may be sequentially stacked over a wafer 10. In the present embodiment, parylene, PPX (Poly-P-Xylylene) or the like may be used as the insulating layer, and PDMS (polydimethylsiloxane) may be used as an elastomer layer. However, the insulating layer or the elastomer layer is not limited to these materials.

In FIG. 4, the first insulating layer 12 stacked over the wafer 10 may be formed as a non-stick layer. That is, the first insulating layer 12 and the elastomer layer 14 may be stacked so as to be separated from each other, without sticking to each other. This is in order to separate the elastomer layer 14, which serves as the substrate of the electrode arrangement, from the wafer 10 after the electrode arrangement is completed.

Figure 5:
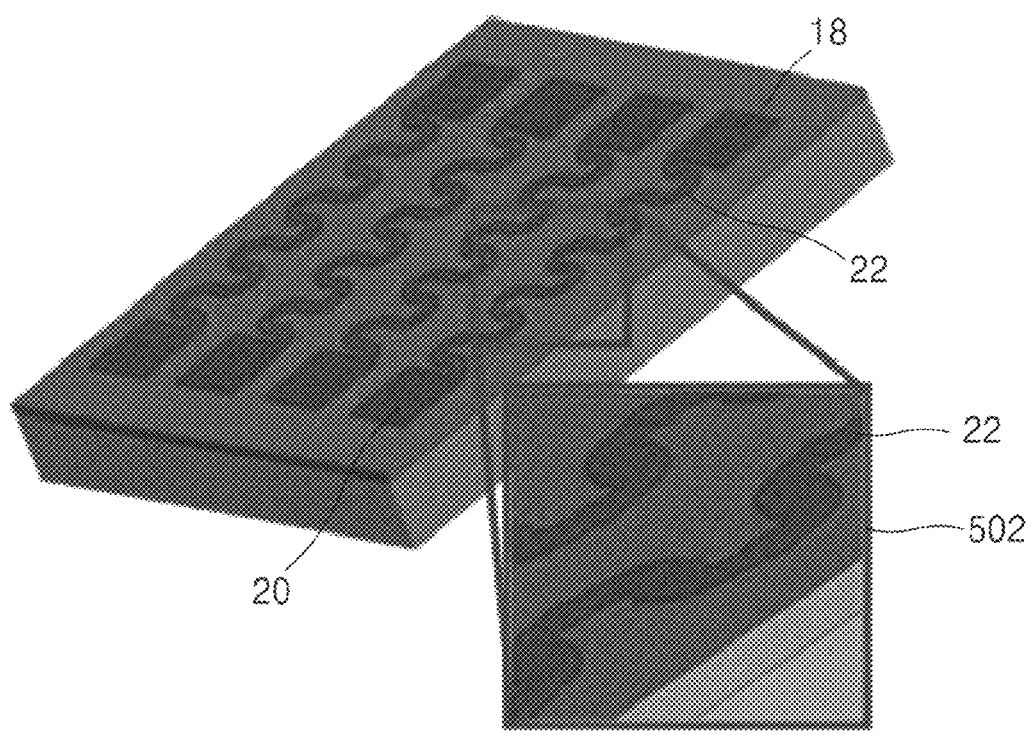

When the substrate is prepared over the wafer 10 as illustrated in FIG. 4, photoresist may be used to pattern a first pad pattern 18, a second pad pattern 20, and a conductive pattern 22 over the substrate as illustrated in FIG. 5. At this time, the conductive pattern 22 may be patterned to be bent in the horizontal direction with respect to the substrate as illustrated in an expanded view 502 of FIG. 5. Thus, the conductive pattern 22 may have a curved shape or S-shape. Furthermore, the conductive pattern 22 may be patterned to connect the first pad pattern 18 and the second pad pattern 20.

Figure 6:
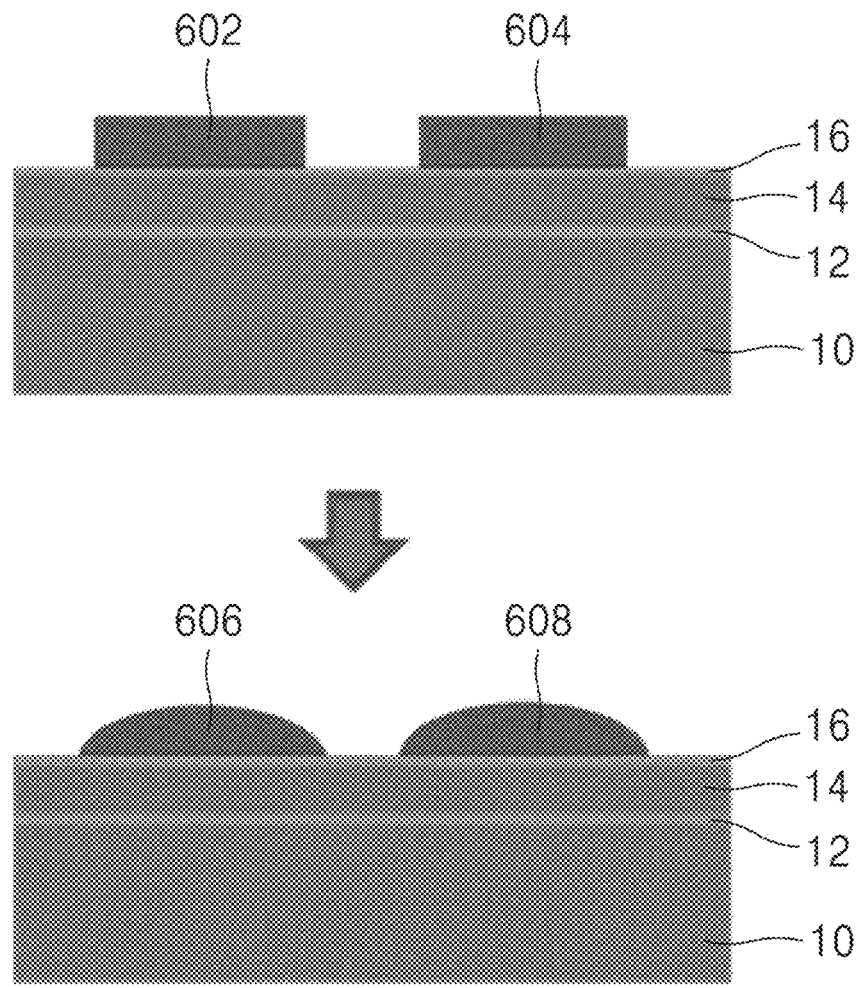

When the patterning process using photoresist is completed as illustrated in FIG. 5, fixation regions may be formed to fix the first pad pattern 18, the second pad pattern 20, and the conductive pattern 22 to the substrate. As illustrated in FIG. 6, when heat is applied at a predetermined temperature to photoresist layers 602 and 604 patterned on the second insulating layer 16, the photoresist layers 602 and 604 may be transformed into photoresist layers 606 and 608 having a hemispherical shape. Such a process of transforming the shape of photoresist by applying heat to the photoresist may be referred to as a reflow process.

Figure 7:
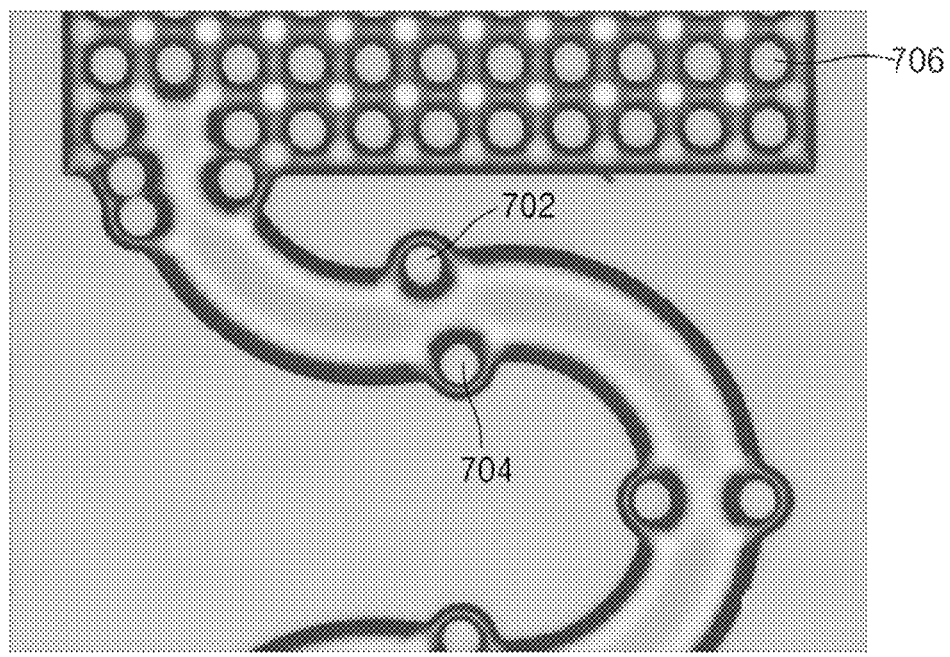

As the heat is applied to the first pad pattern 18, the second pad pattern 20, and the conductive pattern 22, fixation regions 702, 704, and 706 may be formed as illustrated in FIG. 7. Referring to FIG. 7, the fixation regions 702 and 704 may be formed at both sides of the conductive wire so as to fix the conductive wire to the substrate. Furthermore, the plurality of fixation regions 706 may be formed in a predetermined region of the pad pattern so as to fix the pad pattern to the substrate.

Figure 8:
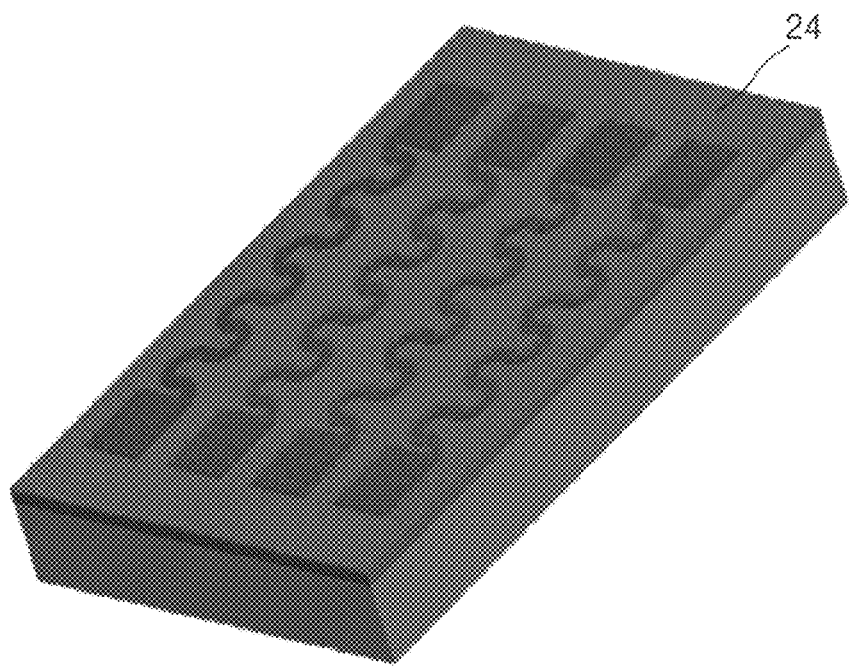

After the fixation regions are formed over the photoresist through the reflow process as illustrated in FIG. 7, the entire region of the substrate may be coated with a third insulating layer 24 as illustrated in FIG. 8.

Figure 9:
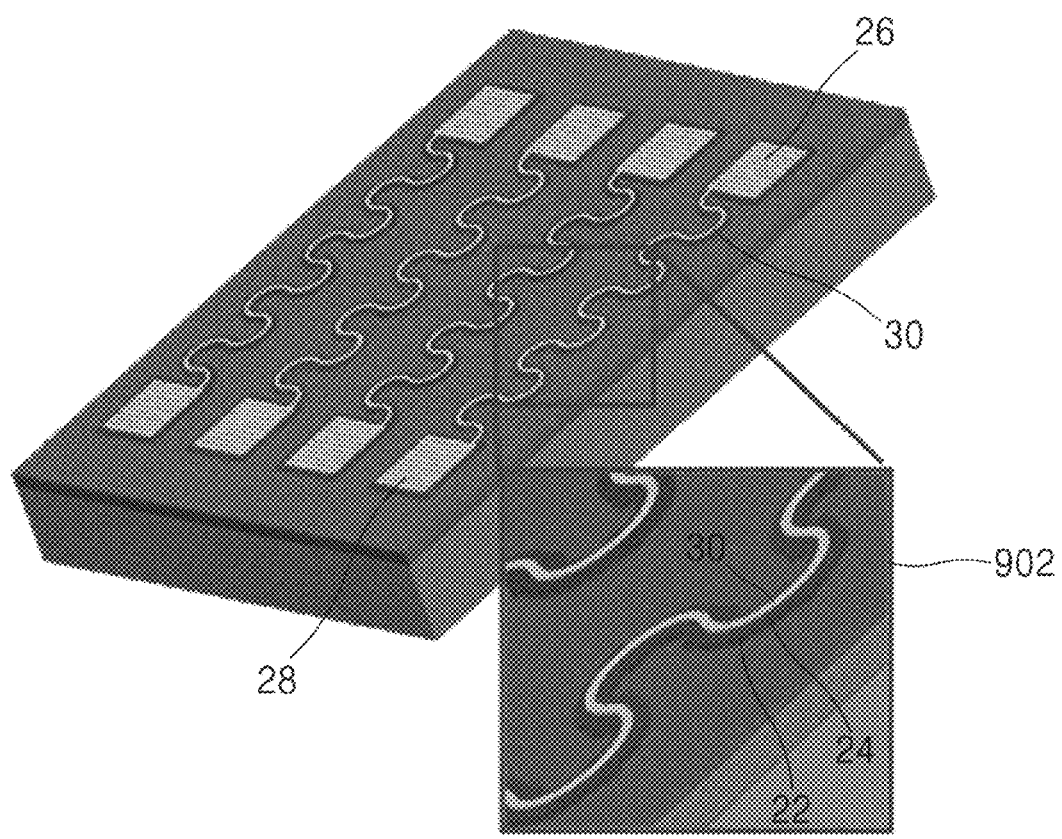

Then, as illustrated in FIG. 9, conductive layers 26, 28, and 30 may be patterned over the first pad pattern, the second pad pattern, and the conductive pattern, respectively, which are formed of photoresist. In the present embodiment, the conductive layer may be formed of a metallic material such as Cr or Au, but is not limited thereto.

Through such a patterning process of the conductive layers, the photoresist layer 22, the third insulating layer 24, and the conductive layer 30 may be sequentially stacked over the substrate and form the first pad pattern, the second pad pattern, and the conductive pattern, as illustrated in an expanded view 902 of FIG. 9.

Figure 10:
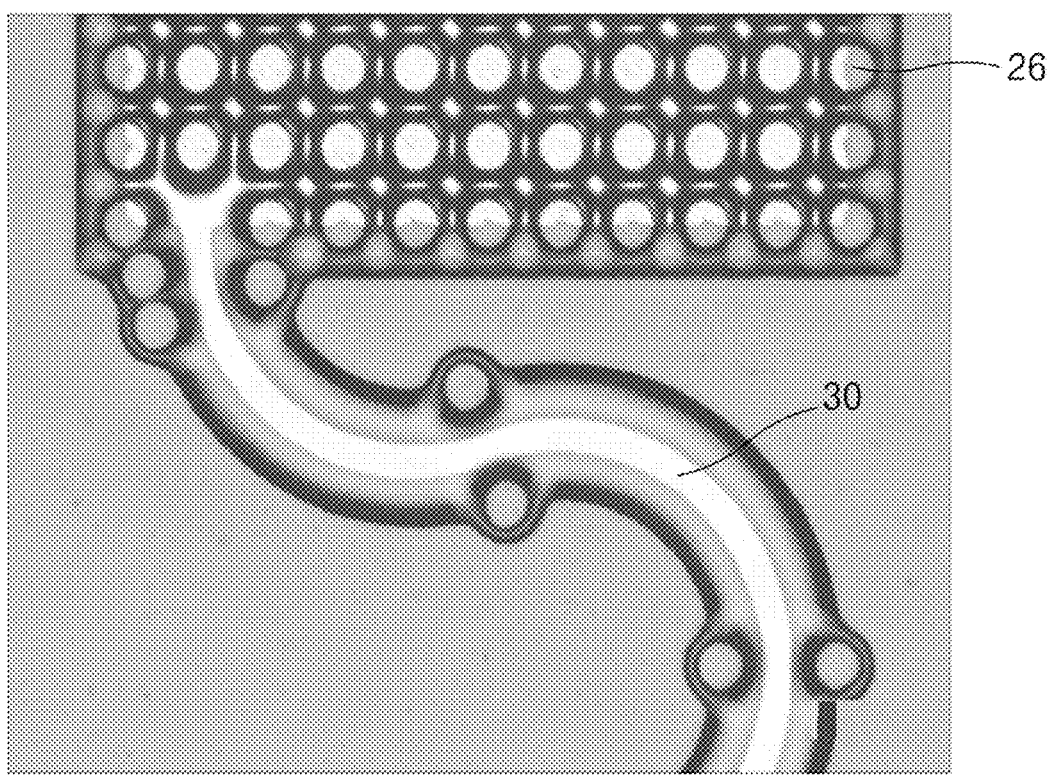

FIG. 10 is an expanded view of parts of the pad pattern and the conductive pattern after the patterning of the conductive layer is completed as illustrated in FIG. 9. As illustrated in FIG. 10, the conductive layers 26 and 30 may be patterned over the pad pattern and the conductive pattern, respectively.

Figure 11:
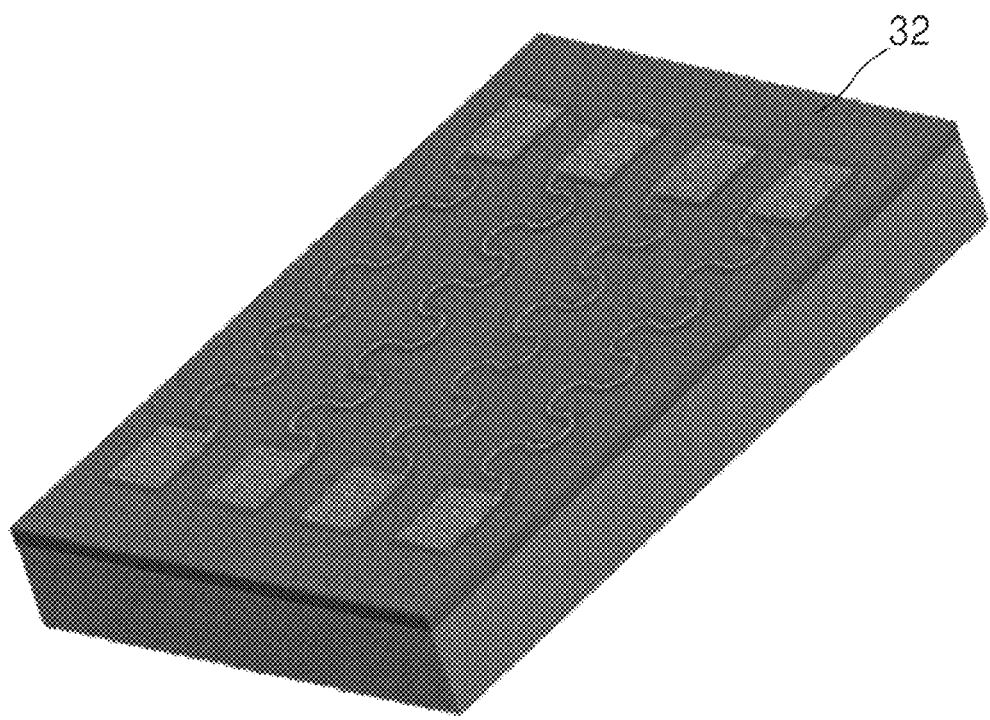

Then, as illustrated in FIG. 11, the entire region of the substrate may be coated with a fourth insulating layer 32.

Figure 12:
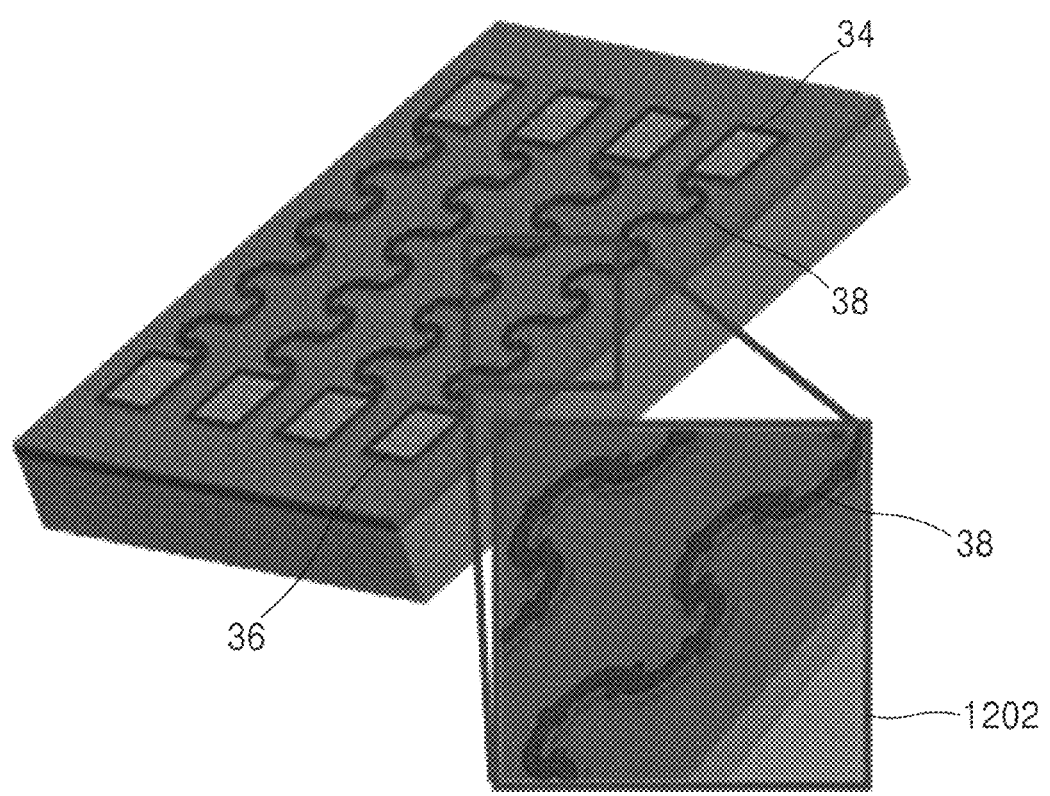

Then, as illustrated in FIG. 12, photoresist layers 34, 36, and 38 may be patterned over the conductive layers along the first pad pattern, the second pad pattern, and the conductive pattern, respectively. At this time, as illustrated in FIG. 12, the photoresist layers 34 and 36 may be patterned along the circumferences of the first and second pad patterns such that a part of the previously patterned conductive layer is exposed over the first and second pad patterns. Furthermore, the photoresist layer 38 over the conductive pattern may be patterned to connect the photoresist layers 34 and 36 patterned over the first and second pad patterns. At this time, the photoresist layer over the conductive pattern may be patterned to completely cover the conductive layer of the conductive pattern and the fixation region for connecting the substrate and the conductive wire, as illustrated in an expanded view 1202 of FIG. 12.

Figure 13:
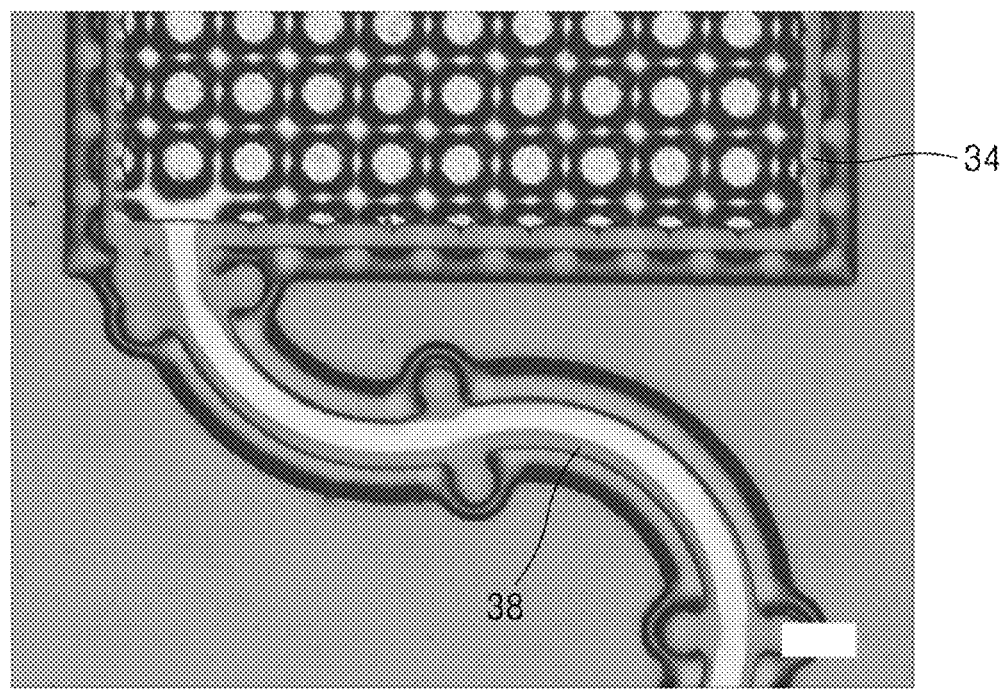

FIG. 13 is an expanded view of parts of the pad pattern and the conductive pattern after the patterning of the photoresist layers is completed as illustrated in FIG. 12. As illustrated in FIG. 12, the photoresist layer 34 may be patterned along the circumference of the pad pattern such that the previously stacked conductive layer is exposed over the pad pattern. Furthermore, the photoresist layer 38 may be patterned to completely cover the conductive layer over the conductive pattern.

Then, all of the insulating layers exposed over the substrate may be removed using the patterned photoresist layers as a mask. At this time, the insulating layers may be removed through an etching process which is publicly known in the art to which the present invention pertains, for example, wet etching or dry etching. In an embodiment of the present invention, the insulating layers may be removed through RIE (Reactive Ion Etching), but another etching process may also be used. When the etching process is performed, the insulating layer of the region excluding the first and second pads and the conductive pattern, which are formed by the photoresist layers and the conductive layers, may be removed to expose the elastomer layer 14 stacked over the wafer 10, as illustrated in FIG. 14.

Figure 14:
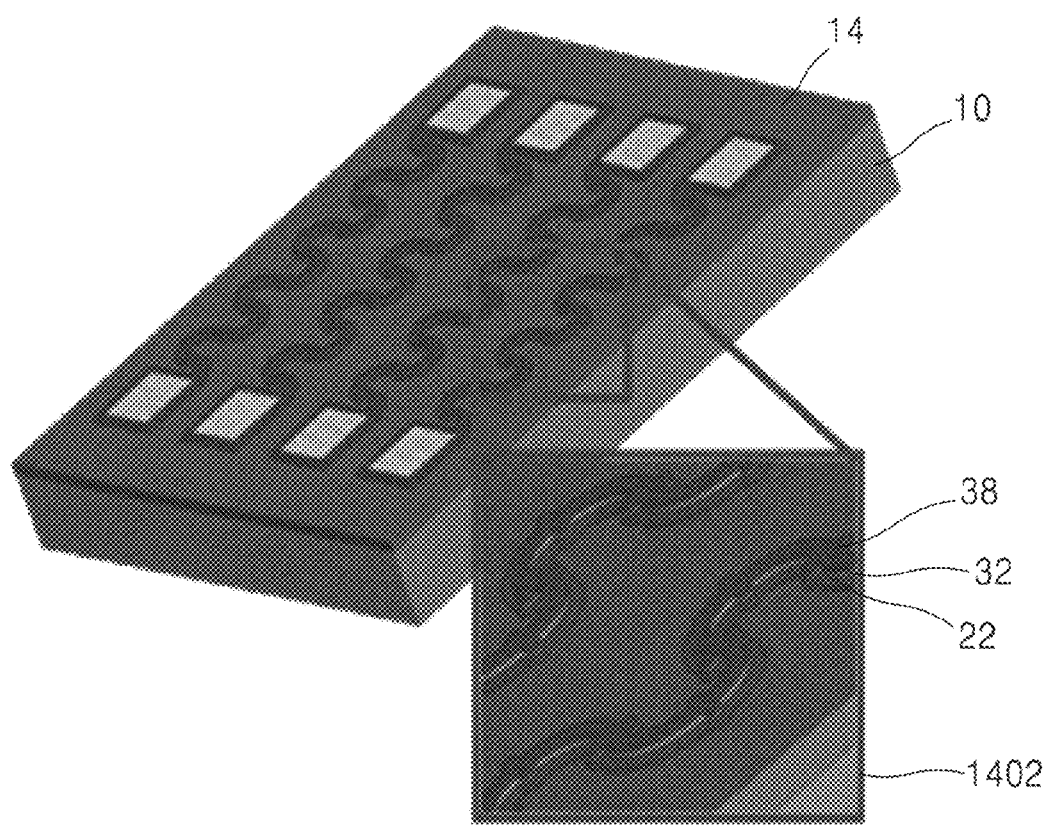

Referring to an expanded view 1042 of FIG. 14, the conductive pattern may include the photoresist layer 22, the insulating layer 32, and the photoresist layer 38 which are sequentially stacked. At this time, although not illustrated in FIG. 14, the previously patterned conductive layer may be stacked between the photoresist layer 22 and the insulating layer 32.

After all of the insulating layers exposed over the substrate are removed using the patterned photoresist layers as a mask, all of the photoresist layers existing over the substrate may be removed.

Figure 15:
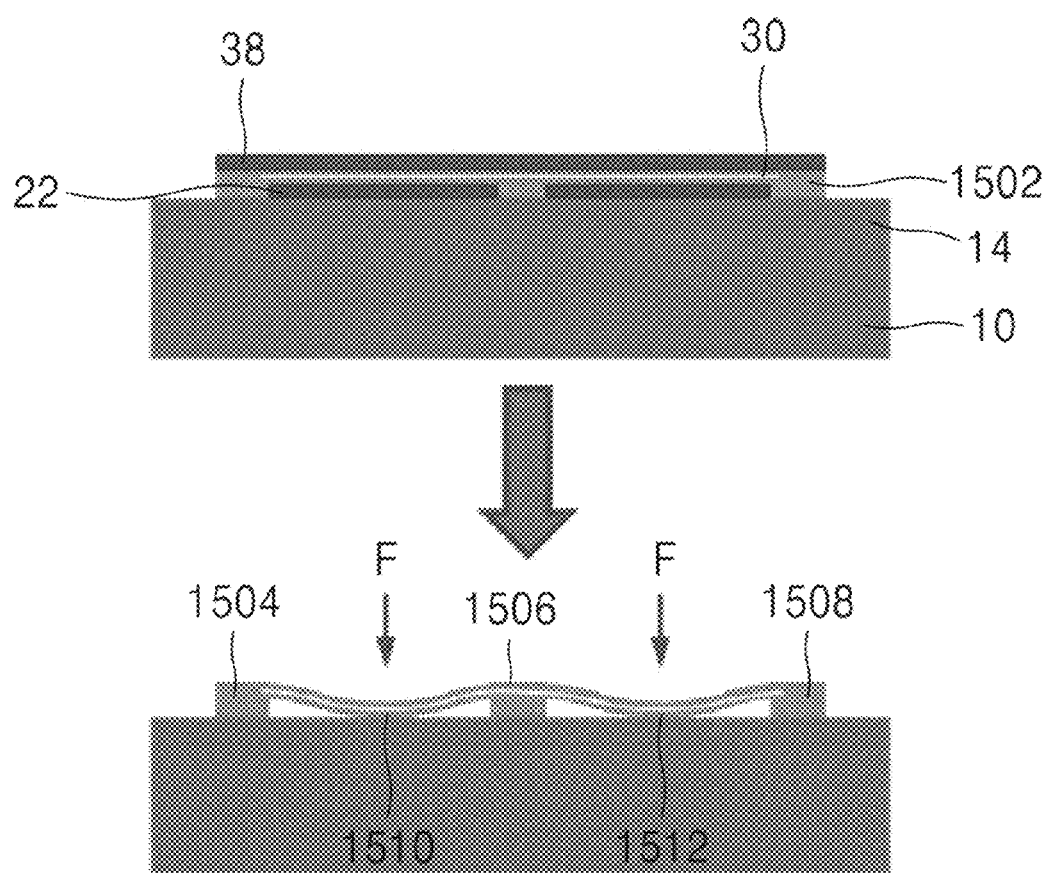

FIG. 15 illustrates a process of forming vertical curves of the conductive wire by removing the photoresist layers over the substrate. As illustrated in FIG. 15, an insulating layer 1502 may be stacked over the elastomer layer 14, that is, the substrate, and the photoresist layer 22 may be stacked in the insulating layer 1502. Furthermore, the insulating layer 1502 may include a conductive layer 30 formed therein. Furthermore, the photoresist layer 38 may also be stacked over the insulating layer 1502. In such a state, when all of the photoresist layers 22 and 38 existing over the substrate are removed, the gravity F facing the substrate may be applied to the insulating layer 1502. Thus, the insulating layer may form contact surfaces 1510 and 1512 with the substrate. Due to the existence of the contact surfaces 1510 and 1512 and non-contact surfaces 1504, 1506, and 1508, the conductive wire formed by the insulating layer 1502 may have a shape bent in the vertical direction with respect to the substrate. In an embodiment of the present invention, the photoresist layers 22 and 38 existing over the substrate may be removed by a wet cleaning process.

Figure 16:
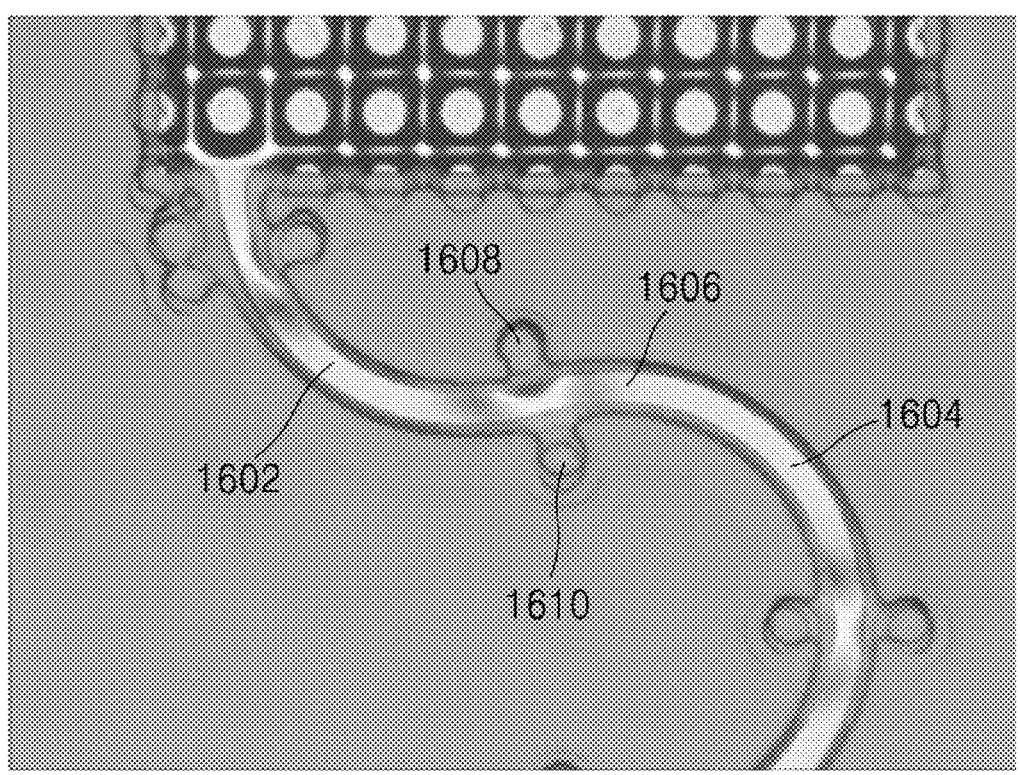

FIG. 16 is a partially expanded view of the conductive wire over the substrate fabricated through the process of FIG. 15. As the photoresist layers are removed, the conductive wire may have regions 1602, 1606, and 1604 which are not in contact with the substrate as illustrated in FIG. 16. Due to the non-contact regions, the conductive wire may have a shape bent in the vertical direction. As illustrated in FIG. 16, the bent conductive wire may be fixed to the substrate by the fixation regions 1608 and 1610 formed at both sides thereof.

Figure 17:
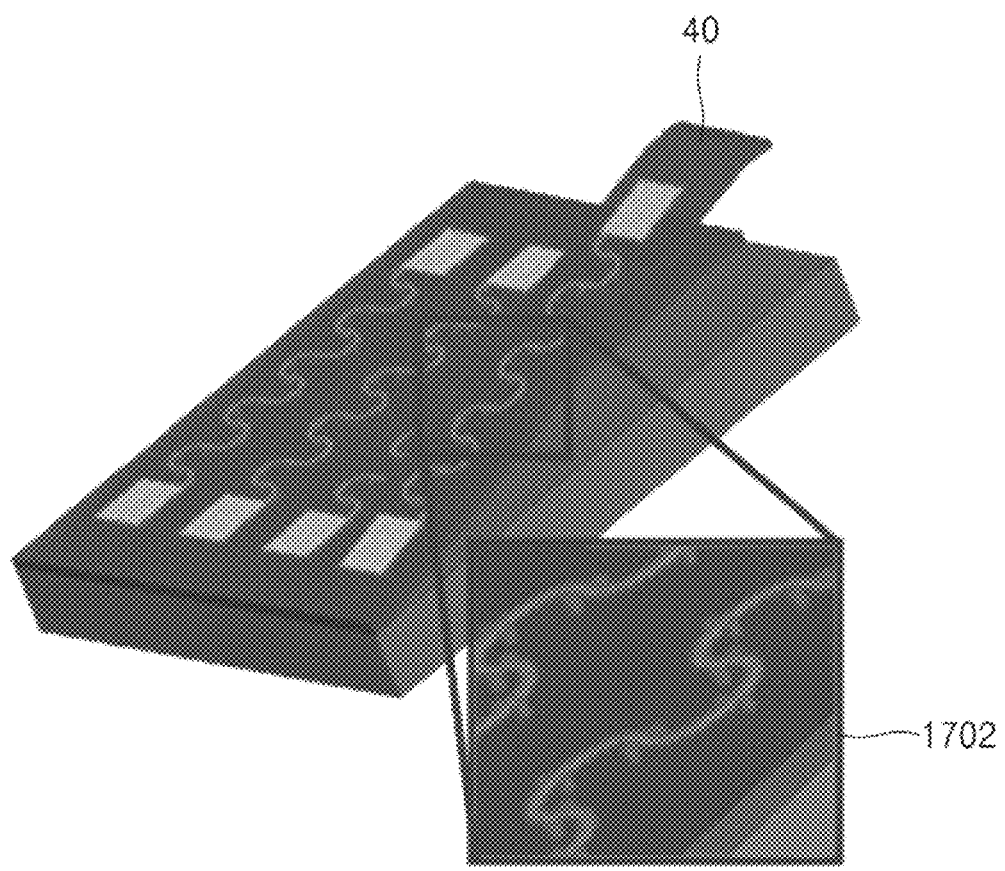

Through the above-described processes, the conductive wire having a shape bent in the horizontal and vertical direction and the first and second pads connected through the conductive wire may be formed as illustrated in an expanded view 1702 of FIG. 17. Finally, the electrode arrangement 40 may be separated from the substrate. Then, the fabrication process of the electrode arrangement may be completed.

Figure 18:
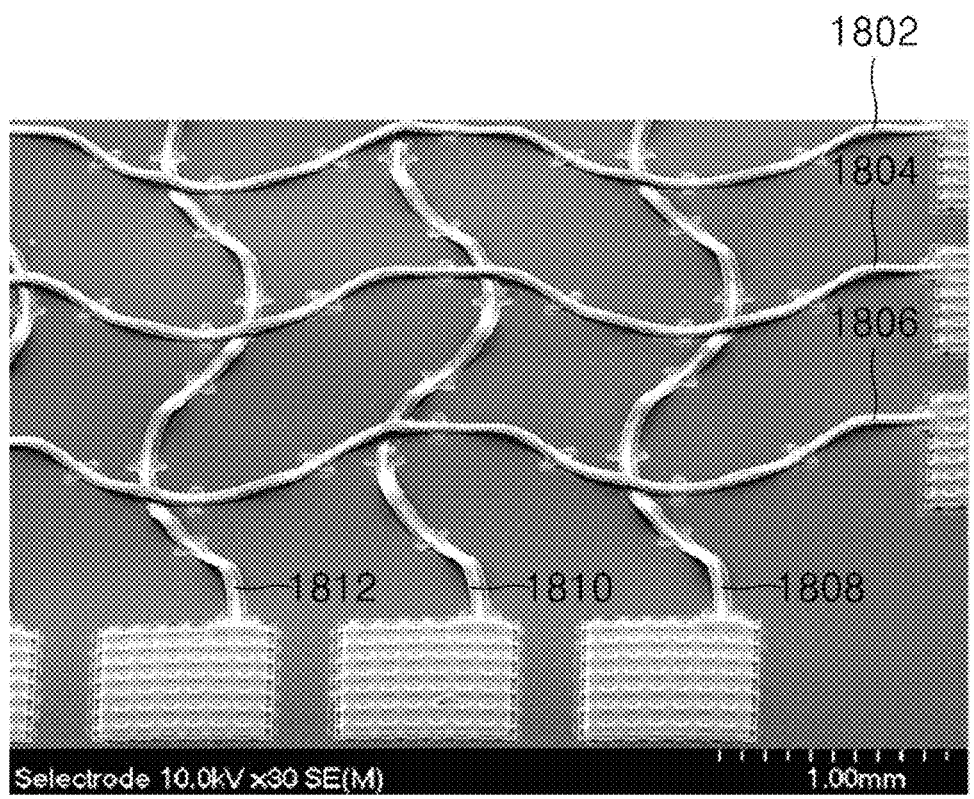
FIGS. 18 and 19 are partial expanded views of an electrode arrangement having a multilayer structure according to an embodiment of the present invention.
Figure 19:
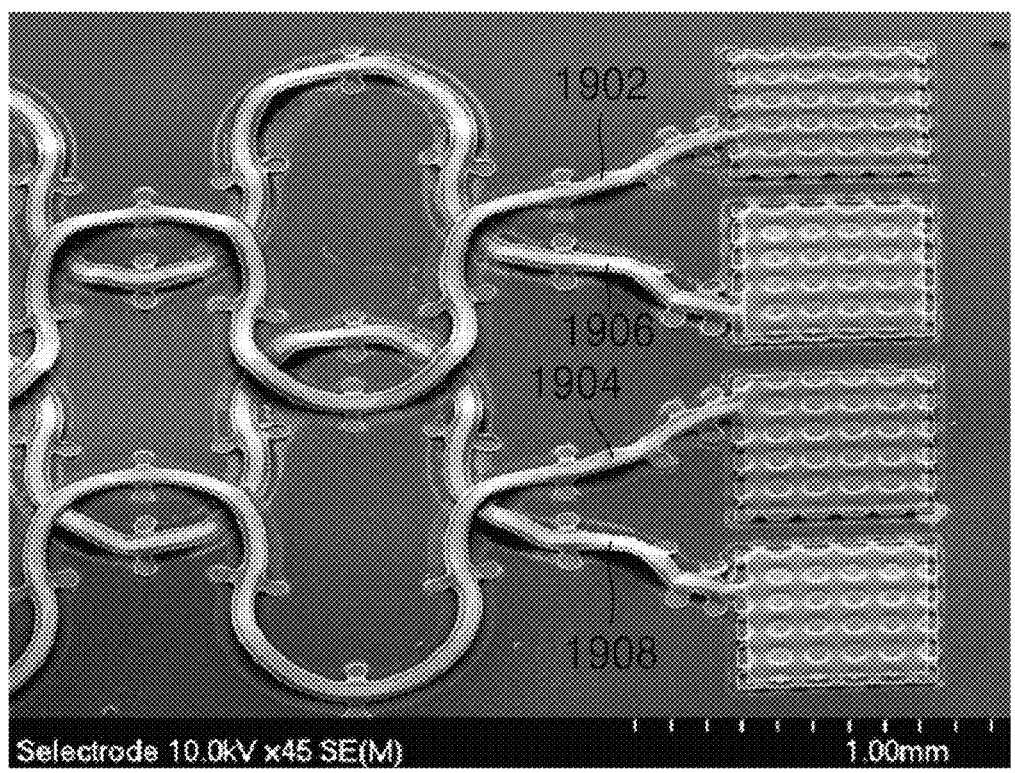

FIGS. 18 and 19 are partial expanded views of an electrode arrangement having a multilayer structure according to an embodiment of the present invention. The electrode arrangement according to the embodiment of the present invention may be formed to have a multilayer structure as illustrated in FIGS. 18 and 19.

For example, as illustrated in FIG. 18, conductive wires of electrode arrangements 1802, 1804, and 1806 may be arranged to cross over conductive wires of other electrode arrangements 1808, 1810, and 1812 and form a multilayer structure. At this time, the conductive wires of the electrode arrangements 1808, 1810, and 1812 pass under the vertically bent regions of the conductive wires of the electrode arrangements 1802, 1804, and 1806, respectively. Thus, the conductive wires of the electrode arrangements 1802, 1804, and 1806 and the conductive wires of the electrode arrangements 1802, 1804, and 1806 may form a multilayer structure without coming in contact with each other.

Furthermore, as illustrated in FIG. 19, electrode arrangements 1902 and 1904 may be arranged in the same direction as other electrode arrangements 1906 and 1908. At this time, the conductive wires of the electrode arrangements 1906 and 1908 pass under the vertically bent regions of the conductive wires of the electrode arrangements 1902 and 1904. Thus, the conductive wires of the electrode arrangements 1902 and 1904 and the conductive wires of the electrode arrangements 1906 and 1908 may form a multilayer structure without coming in contact with each other.

Figure 20:
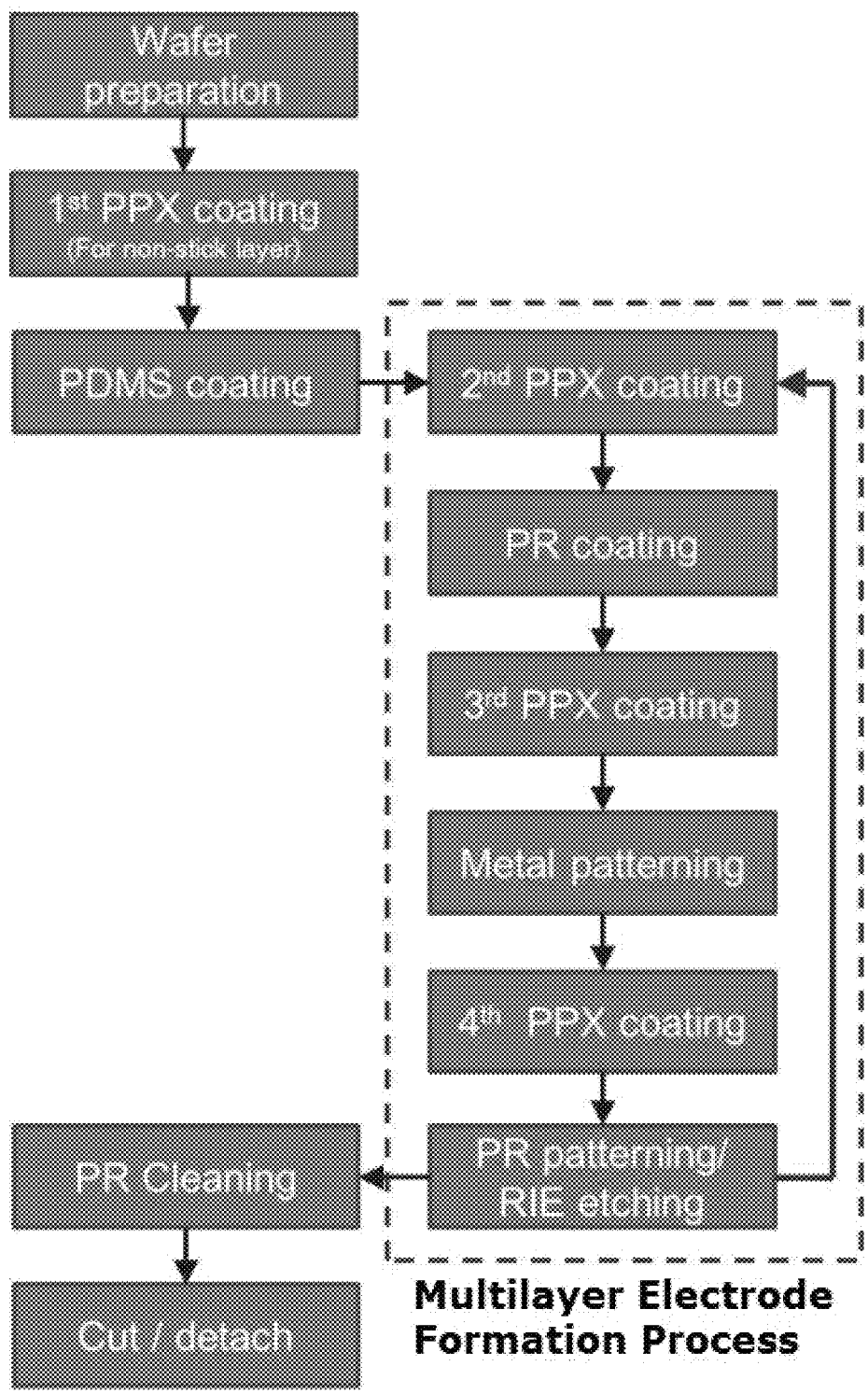
FIG. 20 is a diagram for describing a method for fabricating the multilayer electrode arrangement according to the embodiment of the present invention.

FIG. 20 is a diagram for describing a method for fabricating the multilayer electrode arrangement illustrated in FIG. 18 or 19. In the embodiment of the present invention, the series of processes described with reference to FIGS. 4 to 17 may be performed to form a multilayer electrode arrangement. In particular, the series of processes from the process of applying the second insulating layer 16 as illustrated in FIG. 4 to the process of removing the insulating layer through RIE (Reactive Ion Etching) as illustrated in FIG. 14 may be repeated in order to form the multilayer electrode arrangement.

Hereafter, a test for verifying the characteristics of the electrode arrangement fabricated through the fabrication method according to the embodiment of the present invention, that is, elasticity and flexibility and a test result will be described as follows.

FIG. 20 is a diagram for describing the method for fabricating a multilayer electrode arrangement according to an embodiment of the present invention. A series of processes of forming a multilayer electrode arrangement may be performed as illustrated in FIGS. 4 to 17. That is, the series of processes from the process of applying the second insulating layer 16 as illustrated in FIG. 4 to the process of removing the insulating layer through RIE (Reactive Ion Etching) as illustrated in FIG. 14 may be repeated in order to form the multilayer electrode arrangement.

Figure 21:
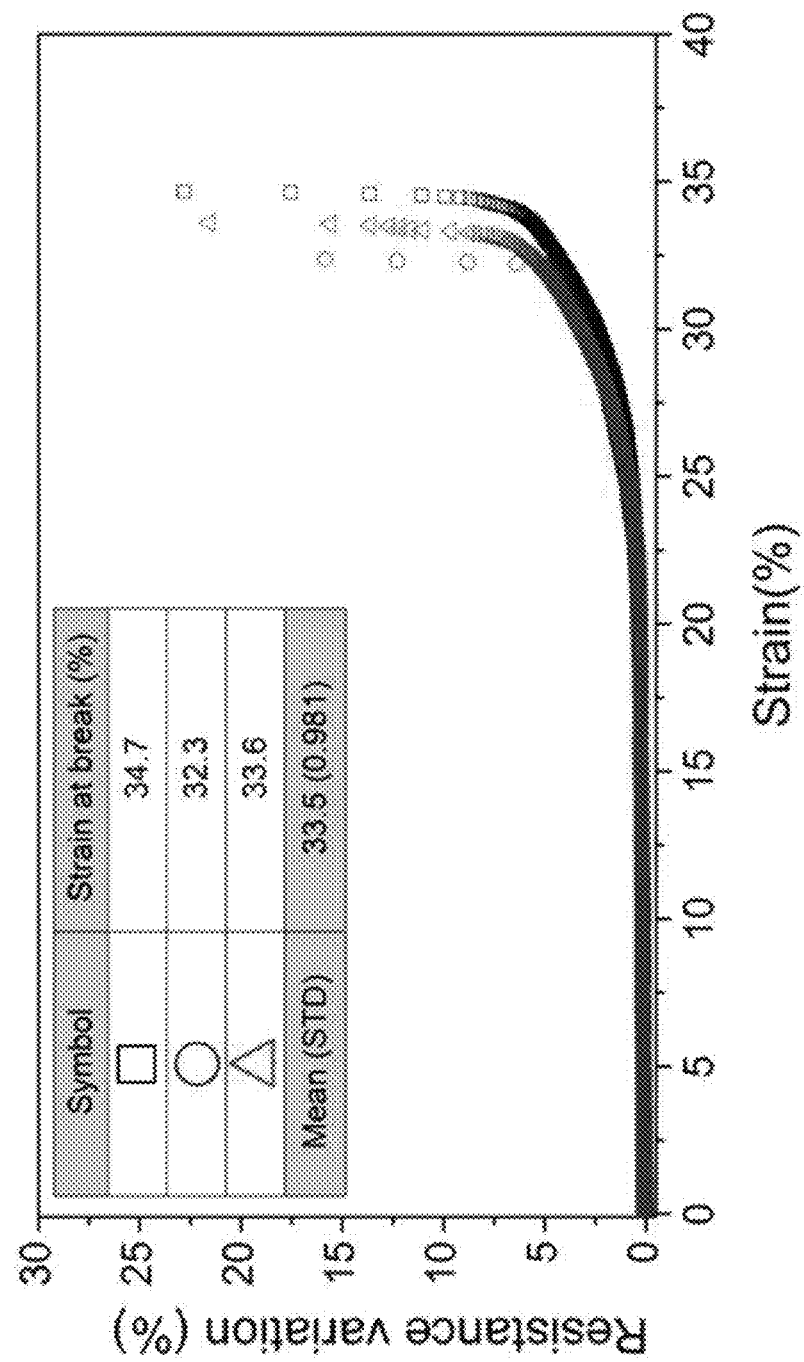
FIGS. 21 and 22 are graphs illustrating results of a test for checking the characteristics of the electrode arrangement fabricated through the fabrication method according to the embodiment of the present invention.
Figure 22:
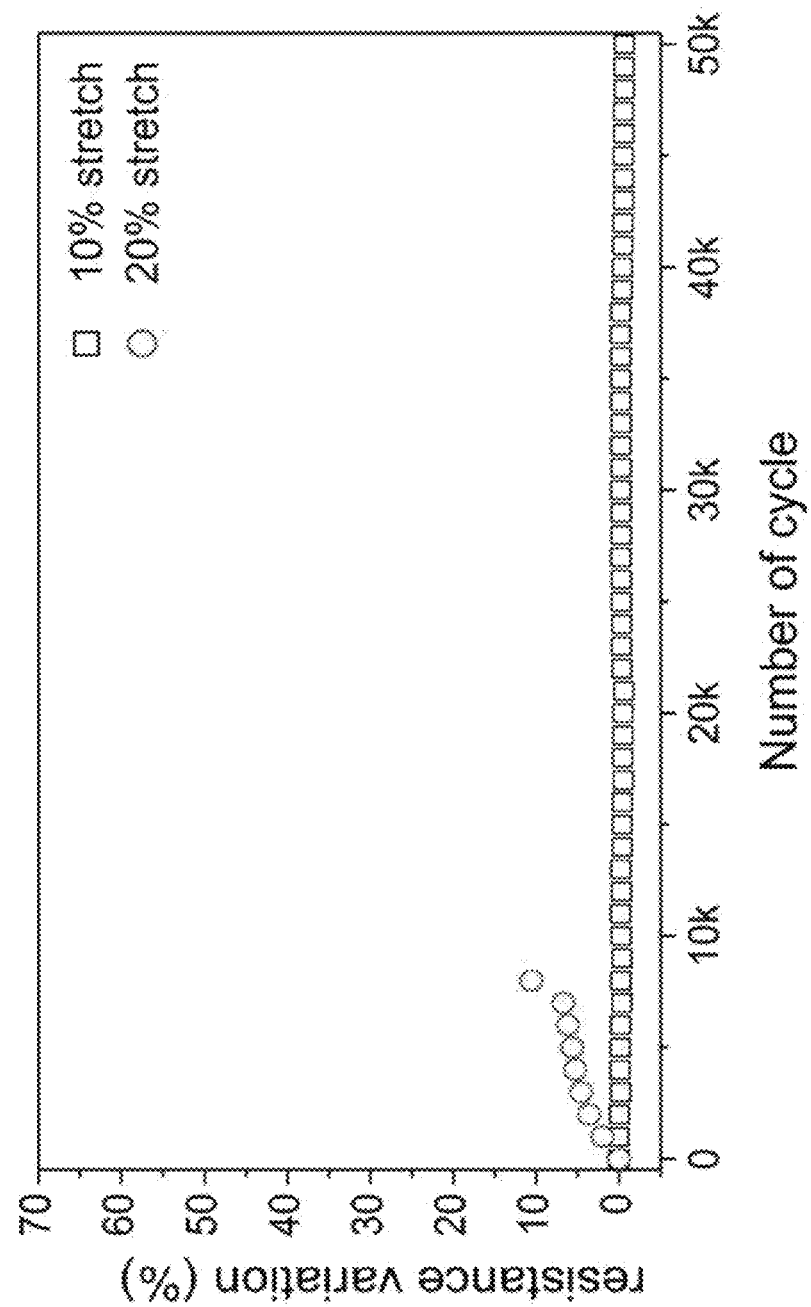

FIGS. 21 and 22 are graphs illustrating results of a test for checking the characteristics of the electrode arrangement fabricated through the fabrication method according to the embodiment of the present invention.

FIG. 21 is a graph illustrating a resistance variation caused by stretch of the electrode arrangement according to the embodiment of the present invention. While both ends of the electrode arrangement are pulled to the outside, strain of the electrode arrangement may be measured, and a resistance variation of the electrode arrangement, caused by the strain, may be measured. The stretch may be performed until the conductive wire of the electrode arrangement breaks to cut off a current flow between the first and second pads. In FIG. 21, total three tests were performed. The respective tests may be represented by different symbols □, ○, and Δ. In FIG. 21, strain at break, that is, strain at the moment when the electrode arrangement breaks during each of the tests may be measured, and the average thereof may be calculated as 33.5%. The graph of FIG. 21 may indicate that almost no resistance variation occurs in a state where the strain of the electrode arrangement is less than 20%. Furthermore, even when the strain of the electrode arrangement ranges from 20% to 25%, the resistance variation of the electrode arrangement does not exceed 10%.

FIG. 22 is a graph illustrating a resistance variation caused by cyclic stretch of the electrode arrangement according to the embodiment of the present invention. Referring to FIG. 22, when the electrode arrangement cyclically stretches and contracts while the strain of the electrode arrangement is maintained at 10%, the resistance of the electrode arrangement is not varied even though the number of cycles increases to 50,000. Furthermore, when the strain of the electrode arrangement is 20%, the resistance variation of the electrode arrangement is less than 10% even though the number of cycles is equal to or less than 8,600.

The tests and the test results of FIGS. 21 to 22 may indicate that the characteristic variation of the electrode arrangement according to the embodiment of the present invention is very low under the condition in which the electrode arrangement is stretched. Furthermore, the test results may prove that the electrode arrangement according to the embodiment of the present invention has excellent elasticity and flexibility.

According to the embodiments of the present invention, it is possible to fabricate an electrode arrangement which includes a conductive wire bent in both of a vertical direction and a horizontal direction with respect to a substrate.

Furthermore, the electrode arrangement may have more excellent elasticity and flexibility than existing electrodes.

Furthermore, the electrode arrangement can be mass-produced, and a high yield can be obtained.

While various embodiments have been described above, it will be understood to those skilled in the art that the embodiments described are by way of example only. Accordingly, the disclosure described herein should not be limited based on the described embodiments.

What is claimed is:

1. An electrode arrangement which is based on elastomer and has elasticity and flexibility, the electrode arrangement comprising:
   an elastomer substrate;
   a plurality of first pads arranged in a first row over the substrate and a plurality of second pads arranged in a second row over the substrate; and
   a plurality of conductive wires respectively connecting one of the first pads and one of the second pads,
   wherein each of the conductive wires includes regions which are bent in a horizontal direction with respect to the substrate,
   wherein each of the conductive wires further includes regions which are bent in a vertical direction with respect to the substrate and are not in contact with the substrate,
   wherein each of the conductive wires further includes at least one fixation region that affixes the conductive wire having the at least one fixation region to the substrate, the at least one fixation region of each conductive wire being an integral part of a corresponding conductive wire that protrudes away from a middle lane of the corresponding conductive wire, and
   wherein at least one of the conductive wires passes under two other conductive wires in each of the regions the two other conductive wires are bent in the vertical direction with respect to the substrate.

2. The electrode arrangement of claim 1, wherein only parts of entire regions of the first and second pads are in contact with the substrate.

3. The electrode arrangement of claim 1, wherein the at least one fixation region has a round-shape.

4. The electrode arrangement of claim 1, wherein the elastomer substrate comprises PDMS (polydimethylsiloxane).

5. The electrode arrangement of claim 1, wherein the conductive wire is curved.

6. The electrode arrangement of claim 1, further comprising:
   a first insulating layer on the substrate facing a first surface of the substrate; and
   a second insulating layer on a wafer facing a second surface of the substrate opposite to the first surface.

7. The electrode arrangement of claim 1, wherein at least one of the two other conductive wires passes over the at least one conductive wire and at least one additional conductive wire such that at least one of the at least one conductive wire or the at least one additional conductive wire is under each of the regions the at least one of the two other conductive wires is bent in the vertical direction with respect to the substrate.

8. The electrode arrangement of claim 1, wherein the at least one fixation region comprises a pair of fixation regions.

9. The electrode arrangement of claim 8, wherein the pair of fixation regions is positioned along the corresponding conductive wire between each of the first pad and the second pad.

10. The electrode arrangement of claim 9, wherein a first fixation region of the pair of fixation regions and a second fixation region of the pair of fixation regions are on opposite sides of the middle lane of the corresponding conductive wire.

11. The electrode arrangement of claim 10, wherein the first fixation region and the second fixation region are symmetrically disposed with respect to the middle lane of the corresponding conductive wire.

* * * * *

UNITED STATES PATENT AND TRADEMARK OFFICE
CERTIFICATE OF CORRECTION

PATENT NO. : 9,967,973 B2
APPLICATION NO. : 14/584291
DATED : May 8, 2018
INVENTOR(S) : Sohee Kim et al.

Page 1 of 1

It is certified that error appears in the above-identified patent and that said Letters Patent is hereby corrected as shown below:

On the Title Page

Item (73) "Assignee:" should read:
GWANGJU INSTITUTE OF SCIENCE AND TECHNOLOGY, Gwangju (KR);
DAEGU GYEONGBUK INSTITUTE OF SCIENCE & TECHNOLOGY, Daegu (KR)

Signed and Sealed this
Twenty-sixth Day of June, 2018

Andrei Iancu
*Director of the United States Patent and Trademark Office*